(12) United States Patent
Nimmakayala et al.

(10) Patent No.: US 7,785,096 B2
(45) Date of Patent: Aug. 31, 2010

(54) ENHANCED MULTI CHANNEL ALIGNMENT

(75) Inventors: Pawan Kumar Nimmakayala, Austin, TX (US); Byung-Jin Choi, Austin, TX (US); Tom H. Rafferty, Austin, TX (US); Philip D. Schumaker, Austin, TX (US)

(73) Assignee: Molecular Imprints, Inc., Austin, TX (US)

( * ) Notice: Subject to any disclaimer, the term of this patent is extended or adjusted under 35 U.S.C. 154(b) by 0 days.

(21) Appl. No.: 12/389,673

(22) Filed: Feb. 20, 2009

(65) Prior Publication Data

US 2009/0169662 A1 Jul. 2, 2009

Related U.S. Application Data

(60) Continuation of application No. 11/694,644, filed on Mar. 30, 2007, now abandoned, and a continuation-in-part of application No. 11/000,321, filed on Nov. 30, 2004, now Pat. No. 7,630,067, which is a division of application No. 11/000,331, filed on Nov. 30, 2003, now Pat. No. 7,292,326.

(60) Provisional application No. 60/788,809, filed on Apr. 3, 2006, provisional application No. 60/788,810, filed on Apr. 3, 2006.

(51) Int. Cl.
*B29C 59/00* (2006.01)
*G01B 9/00* (2006.01)

(52) U.S. Cl. ...................... 425/385; 356/490

(58) Field of Classification Search .............. 425/174.4, 425/385; 356/490; 264/293
See application file for complete search history.

(56) References Cited

U.S. PATENT DOCUMENTS

| | | | |
|---|---|---|---|
| 3,783,520 | A | 1/1974 | King |
| 4,070,116 | A | 1/1978 | Frosch et al. |
| 4,256,829 | A | 3/1981 | Daniel |
| 4,326,805 | A | 4/1982 | Feldman et al. |
| 4,444,801 | A | 4/1984 | Hongo et al. |
| 4,512,848 | A | 4/1985 | Deckman et al. |
| 4,600,309 | A | 7/1986 | Fay |

(Continued)

FOREIGN PATENT DOCUMENTS

JP 55-88332 7/1980

(Continued)

OTHER PUBLICATIONS

Arai et al., Development of a New Parallel Manipulator with Fixed Linear Actuator, in Proceedings of Japan/USA Symposium on Flexible Automation, vol. 1, ASME, New York, pp. 145-149 Jan. 1, 1996.

(Continued)

*Primary Examiner*—Maria Veronica D Ewald
(74) *Attorney, Agent, or Firm*—Laura C. Robinson

(57) ABSTRACT

An imprint lithography system operable for imprinting a pattern into a material deposited between an imprint mold and a substrate, the system including, inter alia, a first set of imaging units positioned at a first angle relative to normal of the substrate; and a second set of imaging units positioned at a second angle relative to normal of the substrate, wherein the first and second angles are not equal to each other.

19 Claims, 7 Drawing Sheets

U.S. PATENT DOCUMENTS

| | | | |
|---|---|---|---|
| 4,707,611 A | 11/1987 | Southwell | |
| 4,722,878 A | 2/1988 | Watakabe et al. | |
| 4,731,155 A | 3/1988 | Napoli et al. | |
| 4,757,207 A | 7/1988 | Chappelow | |
| 4,776,695 A | 10/1988 | van Pham et al. | |
| 4,848,911 A | 7/1989 | Uchida et al. | |
| 4,887,283 A | 12/1989 | Hosono | |
| 4,929,083 A * | 5/1990 | Brunner | 356/400 |
| 4,964,145 A | 10/1990 | Maldonado | |
| 5,028,366 A | 7/1991 | Harakal et al. | |
| 5,072,126 A | 12/1991 | Progler | |
| 5,074,667 A | 12/1991 | Miyatake | |
| 5,148,036 A | 9/1992 | Matsugu et al. | |
| 5,148,037 A | 9/1992 | Suda et al. | |
| 5,151,754 A | 9/1992 | Ishibashi et al. | |
| 5,155,749 A | 10/1992 | DiMilia et al. | |
| 5,160,402 A | 11/1992 | Cheng | |
| 5,171,490 A | 12/1992 | Fudim | |
| 5,179,863 A | 1/1993 | Uchida et al. | |
| 5,204,739 A | 4/1993 | Domenicali | |
| 5,218,193 A | 6/1993 | Miyatake | |
| 5,235,400 A | 8/1993 | Terasawa et al. | |
| 5,259,926 A | 11/1993 | Kuwabara et al. | |
| 5,270,222 A | 12/1993 | Moslehi | |
| 5,331,371 A | 7/1994 | Mori et al. | |
| 5,331,407 A | 7/1994 | Doi et al. | |
| 5,335,066 A | 8/1994 | Yamada et al. | |
| 5,355,219 A | 10/1994 | Araki et al. | |
| 5,386,119 A | 1/1995 | Ledger | |
| 5,403,433 A | 4/1995 | Morrison et al. | |
| 5,414,514 A | 5/1995 | Smith et al. | |
| 5,425,848 A | 6/1995 | Haisma et al. | |
| 5,452,090 A | 9/1995 | Progler et al. | |
| 5,477,058 A | 12/1995 | Sato | |
| 5,493,401 A | 2/1996 | Horie et al. | |
| 5,504,793 A | 4/1996 | Chen | |
| 5,508,527 A | 4/1996 | Kuroda et al. | |
| 5,512,131 A | 4/1996 | Kumar et al. | |
| 5,545,367 A | 8/1996 | Bae et al. | |
| 5,563,684 A | 10/1996 | Stagaman | |
| 5,563,702 A | 10/1996 | Emery et al. | |
| 5,565,114 A | 10/1996 | Saito et al. | |
| 5,601,641 A | 2/1997 | Stephens | |
| 5,625,193 A | 4/1997 | Broude et al. | |
| 5,633,505 A | 5/1997 | Chung et al. | |
| 5,669,303 A | 9/1997 | Maracas et al. | |
| 5,686,993 A | 11/1997 | Kokubo et al. | |
| 5,694,207 A | 12/1997 | Hung et al. | |
| 5,719,495 A | 2/1998 | Moslehi | |
| 5,724,145 A | 3/1998 | Kondo et al. | |
| 5,726,548 A | 3/1998 | Chiba et al. | |
| 5,737,064 A | 4/1998 | Inoue et al. | |
| 5,772,905 A | 6/1998 | Chou | |
| 5,774,574 A | 6/1998 | Hoki | |
| 5,776,748 A | 7/1998 | Singhvi et al. | |
| 5,785,918 A | 7/1998 | Hull | |
| 5,802,914 A | 9/1998 | Fassler et al. | |
| 5,808,742 A | 9/1998 | Everett et al. | |
| 5,820,769 A | 10/1998 | Chou | |
| 5,837,892 A | 11/1998 | Cavallaro et al. | |
| 5,849,209 A | 12/1998 | Kindt-Larsen et al. | |
| 5,849,222 A | 12/1998 | Jen et al. | |
| 5,876,550 A | 3/1999 | Feygin et al. | |
| 5,877,032 A | 3/1999 | Guinn et al. | |
| 5,877,036 A | 3/1999 | Kawai | |
| 5,877,861 A | 3/1999 | Ausschnitt et al. | |
| 5,885,472 A | 3/1999 | Miyazaki et al. | |
| 5,948,470 A | 9/1999 | Harrison et al. | |
| 5,956,216 A | 9/1999 | Chou | |
| 5,999,245 A | 12/1999 | Suzuki | |
| 6,016,696 A | 1/2000 | Bair et al. | |
| 6,019,166 A | 2/2000 | Viswanath et al. | |
| 6,038,280 A | 3/2000 | Rossiger et al. | |
| 6,049,373 A | 4/2000 | Miyatake | |
| 6,052,183 A | 4/2000 | Lee | |
| 6,068,783 A | 5/2000 | Szetsen | |
| 6,079,256 A * | 6/2000 | Bareket | 73/105 |
| 6,081,334 A | 6/2000 | Grimbergen et al. | |
| 6,088,103 A | 7/2000 | Everett et al. | |
| 6,091,485 A | 7/2000 | Li et al. | |
| 6,112,588 A | 9/2000 | Cavallaro et al. | |
| 6,128,085 A | 10/2000 | Buermann et al. | |
| 6,133,576 A | 10/2000 | Shafer et al. | |
| 6,137,562 A | 10/2000 | Masuyuki et al. | |
| 6,150,231 A | 11/2000 | Muller et al. | |
| 6,153,886 A | 11/2000 | Hagiwara et al. | |
| 6,204,895 B1 | 3/2001 | Nakamura et al. | |
| 6,204,922 B1 | 3/2001 | Chalmers | |
| 6,218,316 B1 | 4/2001 | Marsh | |
| 6,245,581 B1 | 6/2001 | Bonser et al. | |
| 6,278,519 B1 | 8/2001 | Rosencwaig et al. | |
| 6,278,809 B1 | 8/2001 | Johnson et al. | |
| 6,285,439 B1 | 9/2001 | Miyatake | |
| 6,295,120 B1 | 9/2001 | Miyatake | |
| 6,297,880 B1 | 10/2001 | Rosencwaig et al. | |
| 6,304,326 B1 | 10/2001 | Aspnes et al. | |
| 6,309,580 B1 | 10/2001 | Chou | |
| 6,334,960 B1 | 1/2002 | Willson et al. | |
| 6,355,198 B1 | 3/2002 | Kim et al. | |
| 6,383,888 B1 | 5/2002 | Stirton | |
| 6,387,787 B1 | 5/2002 | Mancini et al. | |
| 6,388,755 B1 | 5/2002 | Zhao | |
| 6,391,217 B2 | 5/2002 | Schaffer et al. | |
| 6,420,892 B1 | 7/2002 | Krivy et al. | |
| 6,482,742 B1 | 11/2002 | Chou | |
| 6,489,068 B1 | 12/2002 | Kye | |
| 6,517,977 B2 | 2/2003 | Resnick et al. | |
| 6,517,995 B1 | 2/2003 | Jacobson et al. | |
| 6,518,189 B1 | 2/2003 | Chou | |
| 6,522,411 B1 | 2/2003 | Moon et al. | |
| 6,561,706 B2 | 5/2003 | Singh et al. | |
| 6,580,172 B2 | 6/2003 | Mancini et al. | |
| 6,580,505 B1 | 6/2003 | Bareket | |
| 6,603,538 B1 | 8/2003 | Oluseyi et al. | |
| 6,630,410 B2 | 10/2003 | Trapp et al. | |
| 6,633,391 B1 | 10/2003 | Oluseyi et al. | |
| 6,636,311 B1 | 10/2003 | Ina et al. | |
| 6,646,662 B1 | 11/2003 | Nebashi et al. | |
| 6,665,119 B1 | 12/2003 | Kurtz et al. | |
| 6,696,220 B2 | 2/2004 | Bailey et al. | |
| 6,713,238 B1 | 3/2004 | Chou et al. | |
| 6,746,319 B2 | 6/2004 | Tada et al. | |
| 6,753,972 B1 | 6/2004 | Hirose et al. | |
| 6,770,852 B1 | 8/2004 | Stegner | |
| 6,771,374 B1 | 8/2004 | Rangarajan et al. | |
| 6,776,094 B1 | 8/2004 | Whitesides et al. | |
| 6,791,669 B2 | 9/2004 | Poon | |
| 6,809,356 B2 | 10/2004 | Chou | |
| 6,819,426 B2 | 11/2004 | Sezginer et al. | |
| 6,828,244 B2 | 12/2004 | Chou | |
| 6,842,229 B2 | 1/2005 | Sreenivasan et al. | |
| 6,849,558 B2 | 2/2005 | Schaper | |
| 6,871,558 B2 | 3/2005 | Choi et al. | |
| 6,873,087 B1 | 3/2005 | Choi et al. | |
| 6,900,881 B2 | 5/2005 | Sreenivasan et al. | |
| 6,902,853 B2 | 6/2005 | Sreenivasan et al. | |
| 6,908,861 B2 | 6/2005 | Sreenivasan et al. | |
| 6,916,584 B2 | 7/2005 | Sreenivasan et al. | |
| 6,916,585 B2 | 7/2005 | Sreenivasan et al. | |
| 6,919,152 B2 | 7/2005 | Sreenivasan et al. | |
| 6,921,615 B2 | 7/2005 | Sreenivasan et al. | |
| 6,922,906 B2 | 8/2005 | Choi et al. | |
| 6,929,762 B2 | 8/2005 | Rubin | |
| 6,932,934 B2 | 8/2005 | Choi et al. | |

| | | |
|---|---|---|
| 6,954,275 B2 | 10/2005 | Choi et al. |
| 6,986,975 B2 | 1/2006 | Sreenivasan et al. |
| 7,027,156 B2 | 4/2006 | Watts et al. |
| 7,070,405 B2 | 7/2006 | Sreenivasan et al. |
| 7,119,886 B2 | 10/2006 | Leenders et al. |
| 7,136,150 B2 | 11/2006 | Sreenivasan et al. |
| 7,170,589 B2 | 1/2007 | Cherala et al. |
| 7,186,483 B2 | 3/2007 | Sreenivasan et al. |
| 7,281,921 B2 | 10/2007 | Watts et al. |
| 7,292,326 B2 | 11/2007 | Nimmakayala et al. |
| 7,303,383 B1 | 12/2007 | Sreenivasan et al. |
| 7,323,130 B2 | 1/2008 | Nimmakayala et al. |
| 2001/0023042 A1 | 9/2001 | Dirksen et al. |
| 2002/0018190 A1 | 2/2002 | Nogawa et al. |
| 2002/0042027 A1 | 4/2002 | Chou et al. |
| 2002/0069525 A1 | 6/2002 | Hada et al. |
| 2002/0093122 A1 | 7/2002 | Choi et al. |
| 2002/0132482 A1 | 9/2002 | Chou |
| 2002/0150398 A1 | 10/2002 | Choi et al. |
| 2002/0167117 A1 | 11/2002 | Chou |
| 2003/0034329 A1 | 2/2003 | Chou |
| 2003/0062334 A1 | 4/2003 | Lee et al. |
| 2003/0080471 A1 | 5/2003 | Chou |
| 2003/0080472 A1 | 5/2003 | Chou |
| 2003/0081193 A1 | 5/2003 | White et al. |
| 2003/0092261 A1 | 5/2003 | Kondo et al. |
| 2003/0112421 A1 | 6/2003 | Smith |
| 2003/0133126 A1 | 7/2003 | Sarfaty et al. |
| 2003/0179354 A1 | 9/2003 | Araki et al. |
| 2003/0180631 A1 | 9/2003 | Shiota et al. |
| 2004/0021866 A1* | 2/2004 | Watts et al. ............... 356/401 |
| 2004/0032581 A1 | 2/2004 | Nikoonahad et al. |
| 2004/0033515 A1 | 2/2004 | Cao et al. |
| 2004/0036201 A1 | 2/2004 | Chou et al. |
| 2004/0046288 A1 | 3/2004 | Chou |
| 2004/0110856 A1 | 6/2004 | Young et al. |
| 2004/0118809 A1 | 6/2004 | Chou et al. |
| 2004/0131718 A1 | 7/2004 | Chou et al. |
| 2004/0137734 A1 | 7/2004 | Chou et al. |
| 2004/0149687 A1 | 8/2004 | Choi et al. |
| 2004/0156108 A1 | 8/2004 | Chou et al. |
| 2004/0163563 A1 | 8/2004 | Sreenivasan et al. |
| 2004/0192041 A1 | 9/2004 | Jeong et al. |
| 2004/0197843 A1 | 10/2004 | Chou et al. |
| 2004/0207836 A1 | 10/2004 | Chhibber |
| 2004/0250945 A1 | 12/2004 | Zheng et al. |
| 2004/0257571 A1 | 12/2004 | Mieher et al. |
| 2005/0037143 A1 | 2/2005 | Chou et al. |
| 2005/0051742 A1 | 3/2005 | Shiraishi |
| 2005/0064344 A1 | 3/2005 | Bailey et al. |
| 2005/0269745 A1 | 12/2005 | Cherala et al. |
| 2005/0270516 A1 | 12/2005 | Cherala et al. |
| 2005/0271955 A1 | 12/2005 | Cherala et al. |
| 2006/0019183 A1 | 1/2006 | Voisin |
| 2006/0114450 A1 | 6/2006 | Nimmakayala et al. |
| 2006/0115999 A1 | 6/2006 | Sreenivasan et al. |
| 2007/0228609 A1 | 10/2007 | Sreenivasan et al. |
| 2007/0228610 A1 | 10/2007 | Sreenivasan et al. |
| 2007/0243655 A1 | 10/2007 | Schmid et al. |
| 2008/0153312 A1 | 6/2008 | Sreenivasan et al. |
| 2009/0026657 A1 | 1/2009 | Nimmakayala et al. |

FOREIGN PATENT DOCUMENTS

| | | |
|---|---|---|
| JP | 57-7931 | 1/1982 |
| JP | 63-138730 | 6/1988 |
| JP | 1-196749 | 8/1989 |
| JP | 02-24848 | 1/1990 |
| JP | 02-92603 | 4/1990 |
| JP | 02192045 | 7/1990 |
| WO | WO 87/02935 | 5/1987 |
| WO | WO 99/05724 | 2/1999 |
| WO | WO 00/21689 | 4/2000 |
| WO | WO 01/47003 | 6/2001 |
| WO | WO/2004/076963 | 9/2004 |

OTHER PUBLICATIONS

Williams et al., Six Degree of Freedom Mag-Lev Stage Development, SPIE vol. 3051, 856-867 Jan. 1, 1997.

Wang et al., Passive Compliance versus Active Compliance in Robot-Based Automated Assembly Systems, Industrial Robot vol. 25, No. 1, pp. 48-57 Jan. 1, 1998.

Rong et al., Design and Analysis of Flexure-Hinge Mechanism Used in Micro-Positioning Stages, ASME vol. 2, pp. 979-985 Jan. 1, 1994.

Feynman, There's Plenty of Room at the Bottom, Dec. 1, 1959.

Johnson et al., Advances in Step and Flash Imprint Lithography, SPIE Microlithography Conference Feb. 23, 2003.

Chou et al., Lithographically Induced Self-assembly of Periodic Polymer Micropillar Arrays, J. Vac. Sci. Technol. B 17 (6), pp. 3197-3202 Nov. 1, 1999.

Colburn et al., Step and Flash Imprint Lithography: A New Approach to High-Resolution Patterning, Proc. Of SPIE, vol. 3676 Mar. 1, 1999.

Chou, Nanoimprint Lithography and Lithographically Induced Self-Assembly, MRS Bulletin, pp. 512-517 Jul. 1, 2001.

Choi et al., Design of Orientation Stages for Step and Flash Imprint Lithography, Precision Engineering, pp. 192-199 Jan. 1, 2001.

Xia et al., Soft Lithography, Angew. Chem. Int. Ed., pp. 550-575 Jan. 1, 1998.

Mansky et al., Large-Area Domain Alignment in Block Copolymer Thin Films Using Electric Fields, Macromolecules. vol. 31. No. 13, pp. 4399-4401 Jun. 9, 1998.

Chou et al., Imprint Lithography with Sub-10 nm Feature Size and High Throughput, Microelectronic Engineering 35, pp. 237-240 Jan. 1, 1997.

Haisma et al., Mold-assisted Nanolithography: A Process for Reliable Pattern Replication, J. Vac. Sci. Technol. B, pp. 4124-4128 Nov. 1, 1996.

Chou et al., Imprint of Sub-25 nm Vias and Trenches in Polymers, Appl. Phys. Lett. 67 (21) Nov. 20, 1995.

Martin et al., Predication of Fabrication Distortions in Step and Flash Imprint Lithography Templates, Journal of Vacuum Science Technology B 20(6), pp. 2891-2895 Nov. 1, 2002.

White et al., Novel Alignment System for Imprint Lithography, J. Vac. Sci. Technol. B 18(6), pp. 3552-3556 Nov. 1, 2000.

Nguyen, Asymmetric Fluid-Structure Dynamics in Nanoscale Imprint Lithography, The University of Texas at Austin, pp. 1-111 Aug. 1, 2001.

Uchida et al., A Mask-to-Wafer Alignment and Gap Setting Method for X-ray Lithography Using Gratings, J. Vac. Sci. Technol. B 9 (6), pp. 3202-3206 Nov. 1, 1991.

Colburn et al., Step and Flash Imprint Lithography for sub-100 nm Patterning, Proceedings of SPIE vol. 3997, pp. 453-457 Jan. 1, 2000.

Mitsui et al., Application of Two-Wavelength Optical Heterodyne Alignment System in XS-1, Part of the SPIE Conference on Emerging Lithographic Technologies III, SPIE vol. 3676, pp. 455-464 Mar. 1, 1999.

Chou et al., Imprint Lithography with 25-Nanometer Resolution, Science vol. 272, pp. 85-87 Apr. 5, 1996.

Heidari, Nanoimprint Lithography at the 6 in. Wafer Scale, J. Vac. Sci. Technol. B 18(6), pp. 3557-3560 Nov. 1, 2000.

Abstract of Japanese Patent 57-7931, Apr. 14, 2004.

Abstract of Japanese Patent 63-138730, Apr. 14, 2004.

Abstract of Japanese Patent 55-88332, Apr. 14, 2004.

Abstract of Japanese Patent 02-92603, Aug. 12, 2004.

Translation of Japanese Patent 02-92603, Apr. 3, 1990.

Translation of Japanese Patent 02-24848. Jan. 26, 1990.

Abstract of Japanese Patent 02-24848, Jan. 26, 1990.

Office Action from U.S. Appl. No. 10/053,357, filed Dec. 16, 2003.

Chou et al., Ultrafast and Direct Imprint of Nanostructures in Silicon, Nature, col. 417, (Jun. 2002), pp. 835-837 Jun. 1, 2002.

Armitage et al., Analysis of Overlay Distortion Patterns, SPIE vol. 921 Integrated Circuit Metrology, Inspection, and Process Control II Jan. 1, 1988.

Moon et al., Interferometric-Spatial-Phase Imaging for Six-Axis Mask Control, MIT NanoStructures Laboratory, Research Laboraty of Electronics Oct. 17, 2003.

Chen et al., Adaptive Alignment of Photomasks for Overlay Placement, Journal of Vacuum Science. B 20(6), pp. 3009-3105 Nov. 1, 2002.

Schneider et al., The Wave-Printer: Towards Large-Area, Multilayer Microcontact-Printing, Proc. Of 4th euspen International Conference, Glasgos, Scotland (UK) May 1, 2004.

Chou et al., Nanoimprint Lithography, Journal of Vacuum Science Technolgoy B 14(16), pp. 4129-4133 Nov. 1, 1996.

Colburn et al., Development and Advantages of Step-and-Flash Lithography, Solid State Technology Jul. 1, 2001.

Colburn et al., Characterization and Modeling of Volumetric and Mechanical Properties for Step and Flash Imprint Lithography Photopolymers, Journal of Vacuum Science Technology. vol b. 19(6) Nov. 1, 2001.

Bailey et al., Step and Flash Imprint Lithography: Defect Analysis, Journal of Vacuum Science, B 19(6), pp. 2806-2810 Nov. 1, 2001.

Bailey et al., Step and Flash Imprint Lithography: Template Surface Treatment and Defect Analysis, Journal of Vacuum Science, B 18(6), pp. 3572-3577 Nov. 1, 2000.

Wronosky et al., Wafer and Reticle Positioning System for the Extreme Ultraviolet Lithography Engineering Test Stand, Emerging Lithography Technologies, Proceedings of SPIE vol. 3997, pp. 829-839 Jul. 1, 2000.

Schneider et al., Stripes of Partially Fluorinated Alkyl Chains: Dipolar Langmuir Monolayers, J. Chem. Phys. vol. 122, Issue 9 Mar. 1, 2005.

Park et al., Aligning Liquid Crystals Using Replicated Nanopatterns, PSI Scientific Report 2002, vol. VII, p. 85 Mar. 1, 2003.

Deng et al., Simulation of Exposure and Alignment for Nano-imprint Lithography, Proc. SPIE, vol. 4688-93, p. 842-849 Jan. 1, 2002.

Deng et al., Rigorous Electromagnetic Simulation Applied to Alignment Systems, Proc. SPIE, vol. 4346-164, p. 1533-1540 Jan. 1, 2001.

Myron et al., Advanced Mask Metrology Enabling Characterization of Imprint Lithography Templates, SPIE Microlithography Conference Feb. 1, 2005.

Choi et al., Distortion and Overlay Performance of UV Step and Repeat Imprint Lithography, MNE Micro- and Nano-Engineering Conference Sep. 1, 2004.

Nordquist et al., Image Placement Issues for ITO-based Step and Flash Imprint Lithography Templates, J. Vac. Sci. Technol. B, pp. 695-701 Mar. 1, 2004.

Gehoski et al., Evaluation of the Imprio 100 Step and Flash Imprint Lithography Tool, Proceedings of SPIE, vol. 5374, pp. 1006-1016 May 1, 2004.

Dauksher et al., Step and Flash Imprint Lithography Template Characterization, from an Etch Perspective, J. Vac. Sci. Technol. B 21(6), pp. 2771-2776 Nov. 1, 2003.

Choi et al., Layer-to-Layer Alignment for Step and Flash Imprint Lithography, SPIE's 26th Intl. Symp. Microlithography: Emerging Lithographic Technologies, Santa Clara, CA Mar. 1, 2001.

Hess et al., Inspection of Templates for Imprint Lithography, J. Vac. Sci, Technol. B 22(6) Nov. 1, 2004.

* cited by examiner

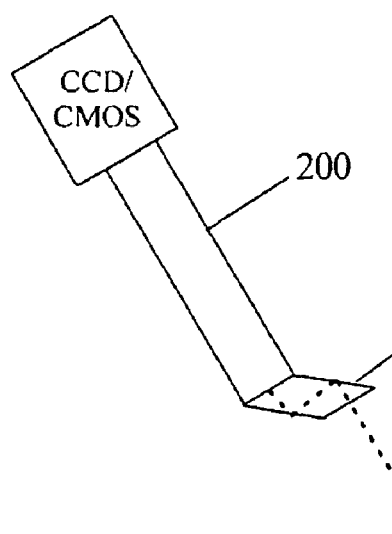
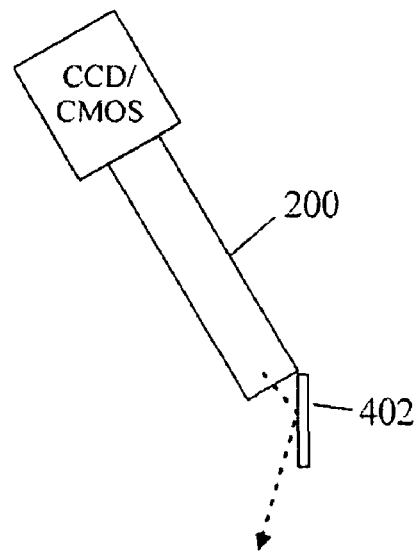
FIG. 4A
FIG. 4B
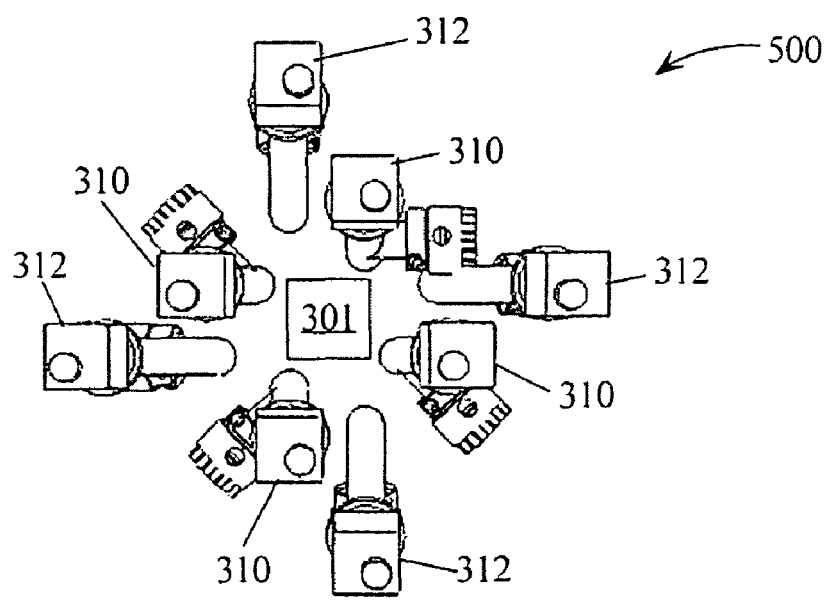
FIG. 5

US 7,785,096 B2

ENHANCED MULTI CHANNEL ALIGNMENT

This application is a continuation of U.S. Ser. No. 11/694,644, filed on Mar. 30, 2007, now abandoned, which claims priority to U.S. Provisional Application No. 60/788,809, filed on Apr. 3, 2006, and U.S. Provisional Application No. 60/788,810 filed on Apr. 3, 2006, all of which are hereby incorporated by reference herein. This application is also a continuation-in-part of U.S. Ser. No. 11/000,321, filed on Nov. 30, 2004 now U.S. Pat. No. 7,630,067, which is a division of U.S. Ser. No. 11/000,331, filed Nov. 30, 2003 now U.S. Pat. No. 7,292,326, both of which are hereby incorporated by reference herein.

BACKGROUND INFORMATION

Nano-fabrication involves the fabrication of very small structures, e.g., having features on the order of nanometers or smaller. One area in which nano-fabrication has had a sizeable impact is in the processing of integrated circuits. As the semiconductor processing industry continues to strive for larger production yields while increasing the circuits per unit area formed on a substrate, nano-fabrication becomes increasingly important. Nano-fabrication provides greater process control while allowing increased reduction of the minimum feature dimension of the structures formed. Other areas of development in which nano-fabrication has been employed include biotechnology, optical technology, mechanical systems and the like.

An exemplary nano-fabrication technique is commonly referred to as imprint lithography. Exemplary imprint lithography processes are described in detail in numerous publications, such as U.S. patent application Ser. No. 10/264,960, U.S. patent application Ser. No. 10/264,926, and U.S. Pat. No. 6,936,194; all of which are assigned to the assignee of the present invention and all of which are incorporated by reference herein.

An imprint lithography technique disclosed in each of the aforementioned U.S. Patent Applications and U.S. Patent includes formation of a relief pattern in a polymerizable layer and transferring a pattern corresponding to the relief pattern into an underlying substrate. The substrate may be positioned upon a motion stage to obtain a desired position to facilitate patterning thereof. To that end, a template is employed spaced-apart from the substrate with a formable liquid present between the template and the substrate. The liquid is solidified to form a solidified layer that has a pattern recorded therein that is conforming to a shape of the surface of the template in contact with the liquid. The template is then separated from the solidified layer such that the template and the substrate are spaced-apart. The substrate and the solidified layer are then subjected to processes to transfer, into the substrate, a relief image that corresponds to the pattern in the solidified layer.

BRIEF DESCRIPTION OF DRAWINGS

FIG. 4 illustrates microscope configurations using beam re-directing optics such as prism and mirror;

FIG. 5 illustrates an exemplary 8-channel imaging system with four sets of the microscopes shown in FIG. 3;

DETAILED DESCRIPTION

Figure 1:
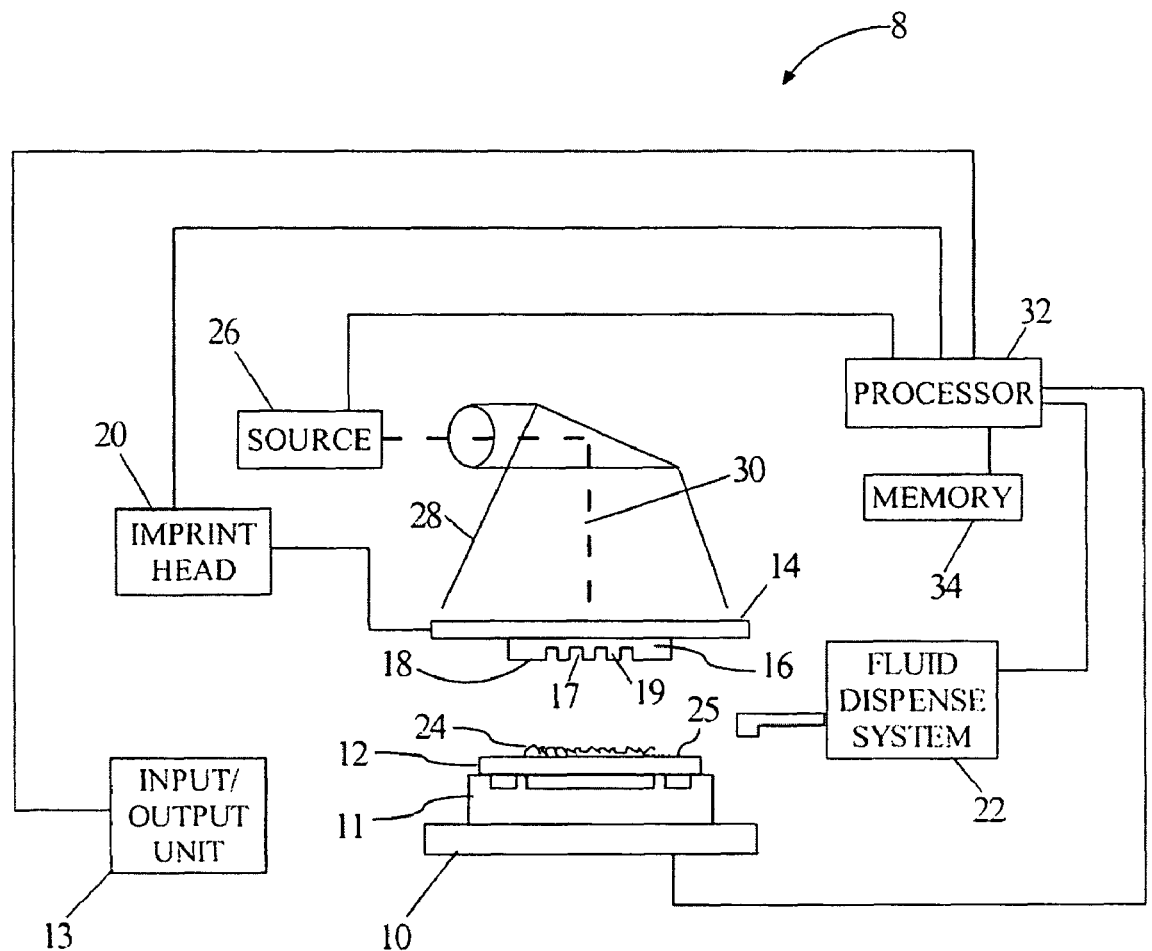
FIG. 1 is a simplified side view of a lithographic system having a template spaced-apart from a substrate.

Referring to FIG. 1, a system 8 to form a relief pattern on a substrate 12 includes a stage 10 upon which substrate 12 is supported and a template 14, having a patterning surface 18 thereon. In a further embodiment, substrate 12 may be coupled to a substrate chuck (not shown), the substrate chuck (not shown) being any chuck including, but not limited to, vacuum and electromagnetic.

Template 14 and/or mold 16 may be formed from such materials including but not limited to, fused-silica, quartz, silicon, organic polymers, siloxane polymers, borosilicate glass, fluorocarbon polymers, metal, and hardened sapphire. As shown, patterning surface 18 comprises features defined by a plurality of spaced-apart recesses 17 and protrusions 19. However, in a further embodiment, patterning surface 18 may be substantially smooth and/or planar. Patterning surface 18 may define an original pattern that forms the basis of a pattern to be formed on substrate 12.

Template 14 may be coupled to an imprint head 20 to facilitate movement of template 14, and therefore, mold 16. In a further embodiment, template 14 may be coupled to a template chuck (not shown), the template chuck (not shown) being any chuck including, but not limited to, vacuum and electromagnetic. A fluid dispense system 22 is coupled to be selectively placed in fluid communication with substrate 12 so as to deposit polymeric material 24 thereon. It should be understood that polymeric material 24 may be deposited using any known technique, e.g., drop dispense, spin-coating, dip coating, chemical vapor deposition (CVD), physical vapor deposition (PVD), and the like.

A source 26 of energy 28 is coupled to direct energy 28 along a path 30. Imprint head 20 and stage 10 are configured to arrange mold 16 and substrate 12, respectively, to be in superimposition and disposed in path 30. Either imprint head 20, stage 10, or both vary a distance between mold 16 and substrate 12 to define a desired volume therebetween that is filled by polymeric material 24.

Referring to FIG. 1 typically, polymeric material 24 is disposed upon substrate 12 before the desired volume is defined between mold 16 and substrate 12. However, polymeric material 24 may fill the volume after the desired volume has been obtained. After the desired volume is filled with polymeric material 24, source 26 produces energy 28, e.g., broadband energy that causes polymeric material 24 to solidify and/or cross-link conforming to the shape of a surface 25 of substrate 12 and patterning surface 18, defining a patterned layer 50 on substrate 12.

The broadband energy may comprise an actinic component including, but not limited to, ultraviolet wavelengths, thermal energy, electromagnetic energy, visible light and the like. The actinic component employed is known to one skilled in the art and typically depends on the material from which imprinting layer 12 is formed. Control of this process is regulated by a processor 32 that is in data communication with stage 10, imprint head 20, fluid dispense system 22, source 26, operating on a computer readable program stored in memory 34.

Embodiments of the present invention are an enhancement of a previously disclosed system referred to as the iMAT system, described in U.S. Pat. No. 7,292,326 which is assigned to the assignee of the present invention and is incorporated by reference herein. The embodiments have the following advantages:

1. More microscopes (i.e., >6) and hence more data points are measured; and

2. Fully automated for all absolute positioning. (A unique feedback scheme is also explained for field size reconfiguration.)

Figure 2:
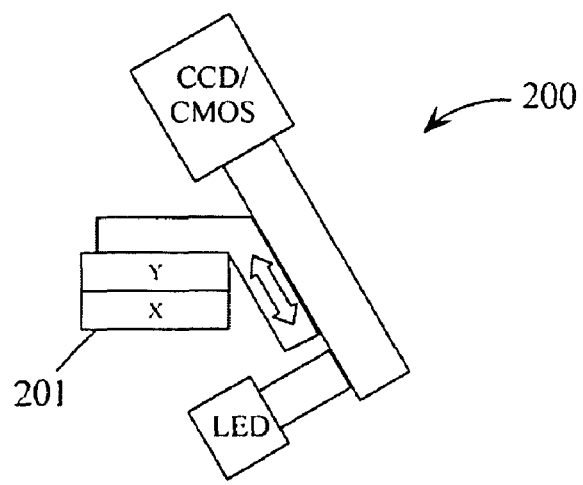
FIG. 2 illustrates an inclined microscope unit having x-y and focusing motions.

FIG. 2 illustrates an inclined microscope unit 200 that can capture the alignment mark images without blocking the UV beam path. This imaging unit 200 is attached on an absolute positioning X-Y stage 201 and it has a focusing automation. Such an absolute X-Y positioning is necessary to relocate each microscope 200 according to the field size or the location of the alignment marks. On practical embodiment is to use a set of small motion range linear sliders that are coupled with actuators and LVDTs (Linear Variable Differential Transformers). Other proposed feedback devices are potentiometers and laser distance measuring sensors, etc.

Precise imprinting requires alignment systems that align the imprint mold in precise alignment with the substrate (wafer) and portions thereof. Multiple imaging systems are utilized to align with marks on the substrate.

When it is necessary to fit multiple microscope units so that multiple alignment marks can be imaged, mechanical interference must be handled carefully. As presented in U.S. Pat. No. 7,292,326, alignment measurement systems in this invention do not use a large NA (Numerical Aperture) microscope. However, the relative small field sizes where multiple alignment marks are positioned make the microscope configuration task very difficult even with low NA (<0.1) microscopes. If the imprint field size is 26 mm by 33 mm, it may be necessary to position two imaging units next to each other where their beam paths are spaced by less than 26 mm. Further, if the two alignment marks are closer to each other, the space between their corresponding imaging units needs to be smaller too. In order to overcome the limited space problems, alternative microscope configurations are herein disclosed.

Figure 3:
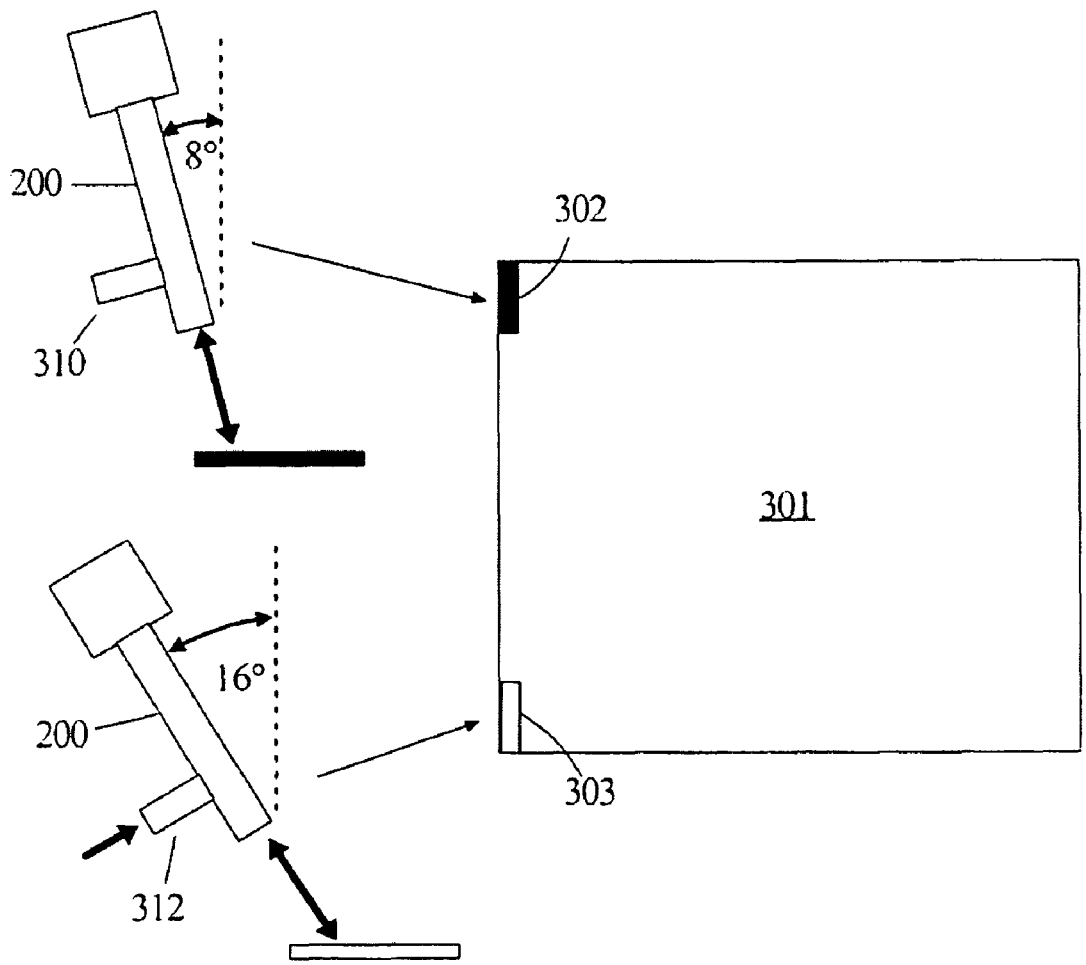
FIG. 3 illustrates microscopes with different inclined angles depending on the $1^{st}$ order reflecting angle of the imaging grating.

FIG. 3 illustrates two microscope units 200 with different inclined angles (8 degrees and 16 degrees). By altering the inclined angles, it is possible to bring their focusing points much closer as compared to the case of the same inclined angle configuration. Inclined angles are mainly governed by the grating pitch. As shown, microscope 200 at the 8 degree pitch aligns to alignment mark 302 on substrate 301, while microscope 200 at the 16 degree pitch aligns to alignment mark 303.

Referring to FIGS. 4A and 4B, there are illustrated two alternative microscope configurations utilizing microscope 200 with either beam offset optics (prism) 401 or mirrors 402. Prism 401 can either off-set or bend the beam path from microscope 200 so that two focusing points can be positioned closely. Mirrors 402 may be used also to bend the beam path. Further, microscope angles may be altered as illustrated.

FIG. 5 illustrates a top view of an 8-channel alignment system 500. Each microscope can be relocated along its measuring side of the field. The system comprises four sets of the image capturing units 310, 312 positioned around the imprint field 301. Since more microscopes can be used, more alignment targets can be captured.

Figure 8B:
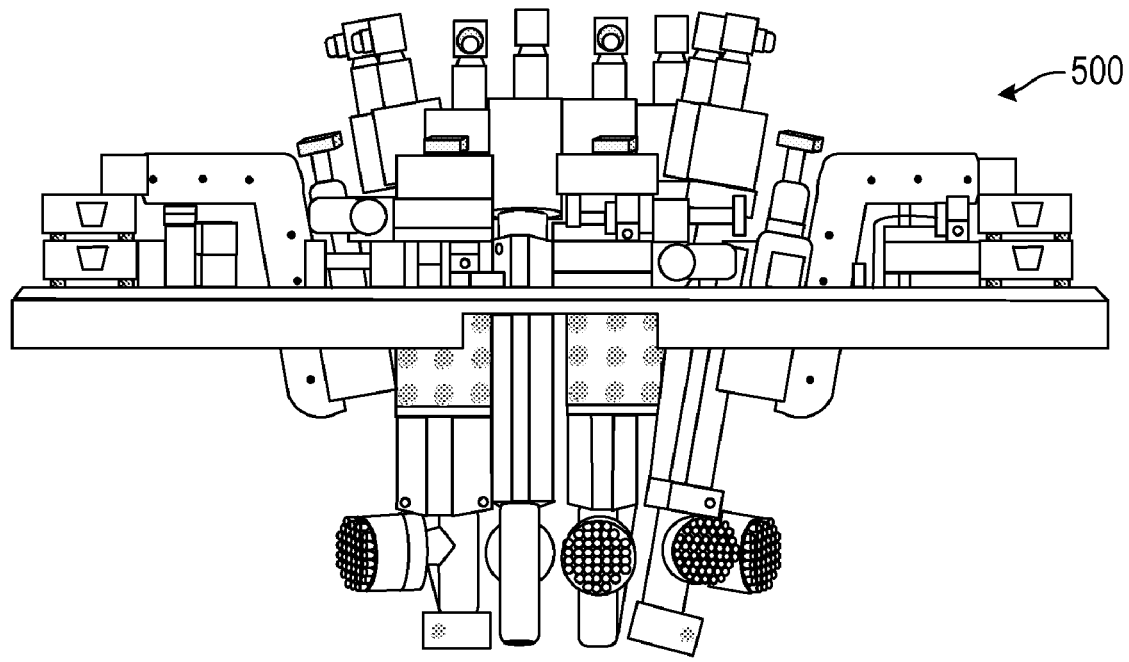
FIG. 8B illustrates a side view showing more detail of system 500.
Figure 8A:
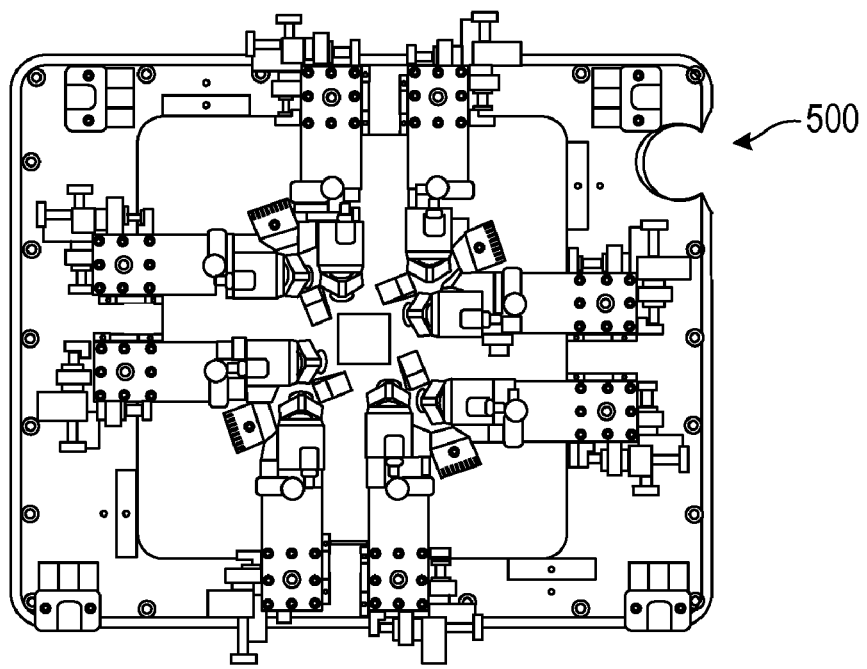
FIG. 8A illustrates a top view of a more detailed depiction of system 500.
Figure 10:
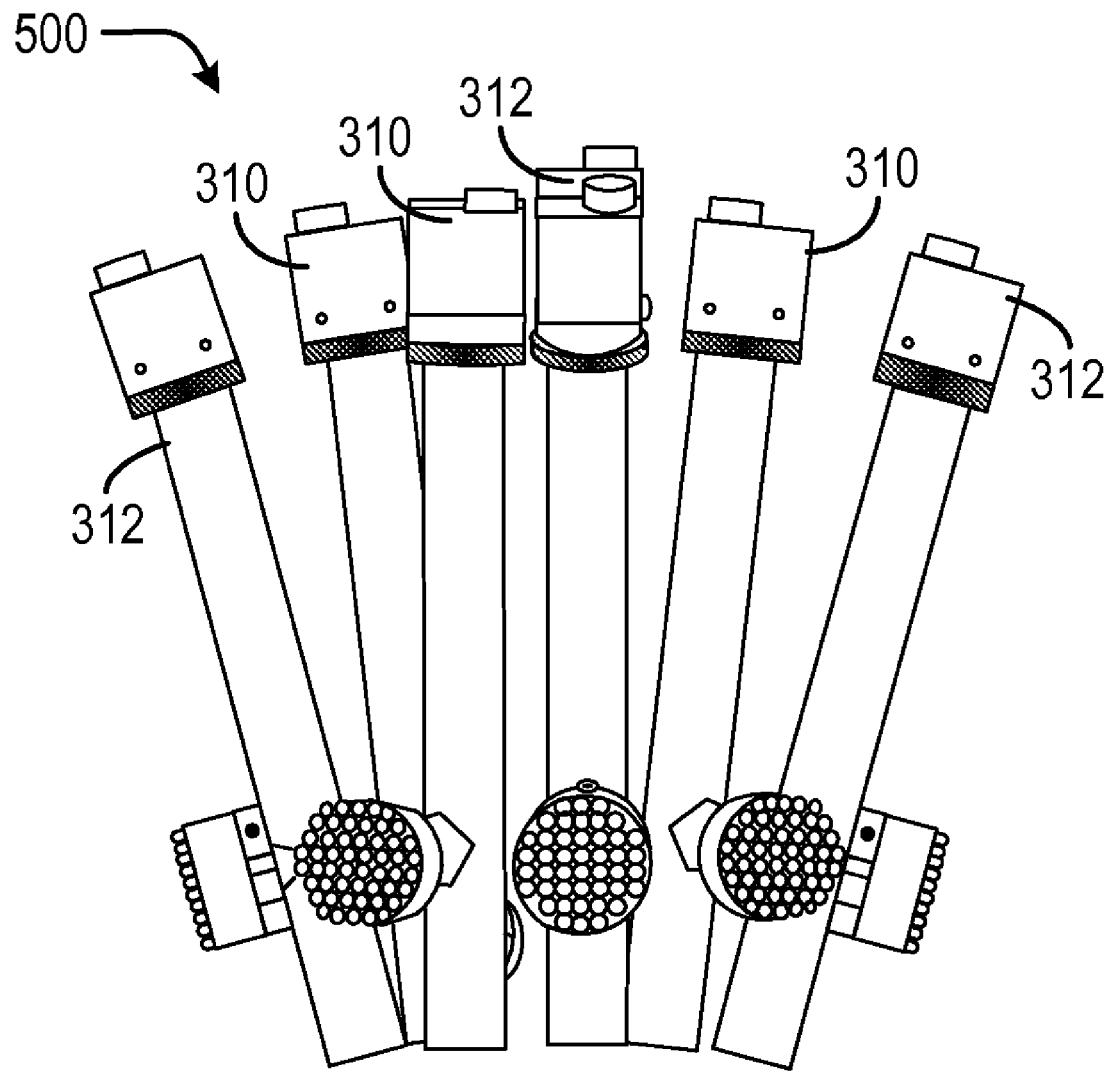
FIG. 10 illustrates a side view of system 500.

FIG. 10 illustrates a more detailed side view of system 500. FIG. 8A illustrates a more detailed top view of system 500 as it may be used in the iMAT system. FIG. 8B illustrates a side view of system 500 shown in FIG. 8A.

When a multiple channel imaging unit is assembled on the tool, it may be necessary to calibrate their final position. Typical accuracy of such calibration is in the range of 50 microns or less. Therefore, the accuracy in the fabrication or assembly itself would not be sufficient. This problem can be solved by using a reference template/wafer that contains grating based marks so that imaging system can read during the initial tool set up.

Figure 6:
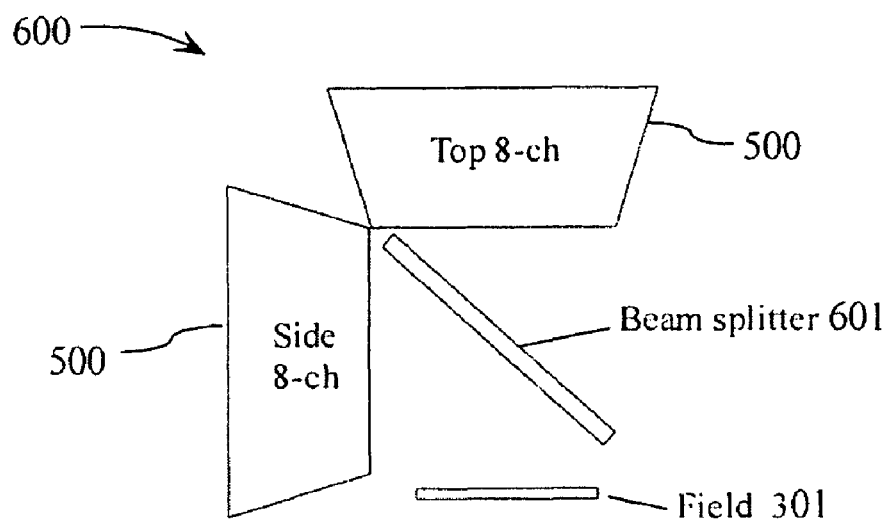
FIG. 6 illustrates a 16-channel imaging system using a beam splitter and two sets of the systems shown in FIG. 5.
Figure 7:
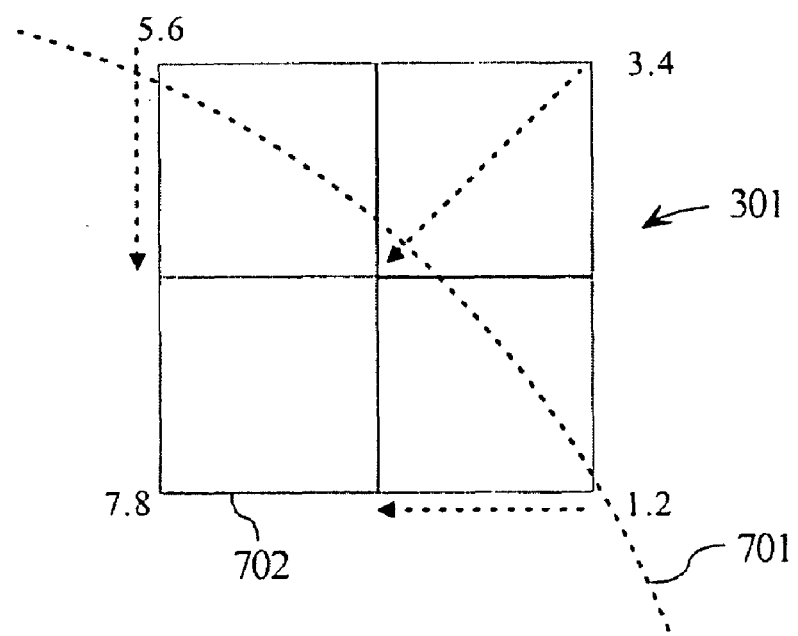
FIG. 7 illustrates relocated imaging channels corresponding to a change of imprinting field size for a case of partial field imprinting (left lower is being imprinted) where microscopes 1 through 6 are relocated.
Figure 9:
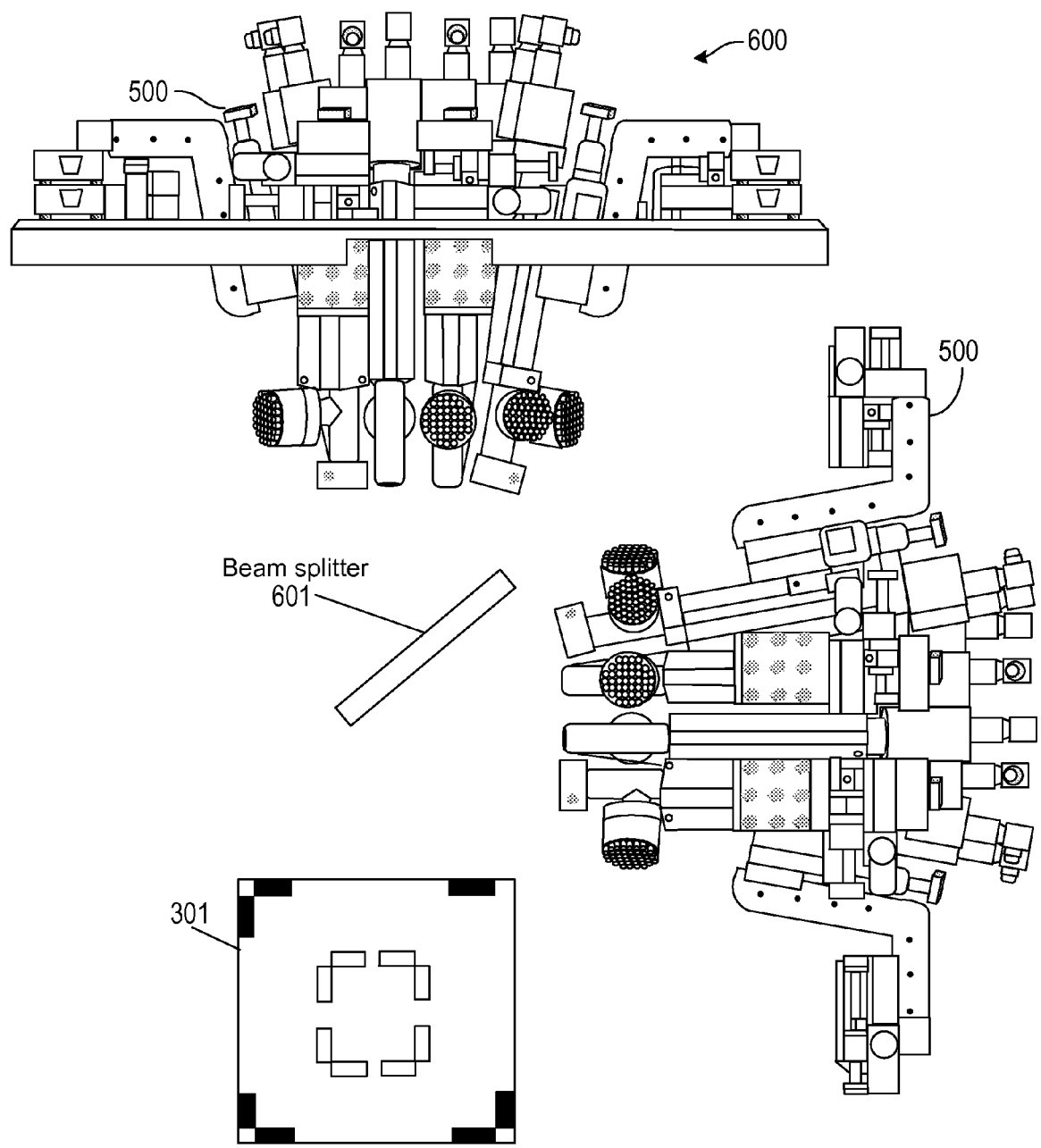
FIG. 9 illustrates a more detailed depiction of system 600.

Referring to FIG. 6, when more than 8 channels are required, it is possible to use a beam splitter 601 and two 8-channel units 500 to compose a 16-channel unit 600. FIG. 9 illustrates a more detailed depiction of system 600 as it may be used in an iMAT system.

As already presented in U.S. Pat. No. 7,292,326, similar inclined imaging systems may be used for whole substrate imprinting processes, where the imaging unit does not block the curing UV beams. By combining both low resolution marks and high resolution moiré marks on the substrate and template, a modified microscope system may be used to capture the alignment target for whole substrate imprinting processes. Typically, low resolution alignment can provide micron-level accuracy. Such a micro level accuracy may be used also to define a "region of interest (ROI)" for the moiré pattern processing. For the systems presented herein, it may be necessary to make both the low resolution marks and moiré grating with identical pitch.

The embodiments of the present invention described above are exemplary. Many changes and modifications may be made to the disclosure recited above, while remaining within the scope of the invention. Therefore, the scope of the invention should not be limited by the above description, but instead should be determined with reference to the appended claims along with their full scope of equivalent.

What is claimed is:

1. An imprint lithography system operable for imprinting a pattern into a material deposited between an imprint mold and a substrate, the system comprising:

a first set of imaging units positioned at a first acute angle relative to normal of the substrate; and a second set of imaging units positioned at a second acute angle relative to normal of the substrate, wherein the first and second angles are not equal to each other;

wherein the first and second sets of imaging units each comprise at least four imaging units and the first set of imaging units and the second set of imaging units comprise a N-channel imaging system, further comprising:

a M-channel imaging system having first and second N-channel imaging systems positioned at an angle to each other; and a beam splitter operable for directing imaging light beams from both N-channel imaging systems towards alignment marks on the substrate.

2. The system of claim 1, wherein the imaging units are operable to view alignment marks on the substrate in order to properly align the system with an imprinting field on the substrate.

3. The system of claim 2, further comprising x-y actuators for re-aligning certain ones of the imaging units in order to align the system for imprinting of a portion of the imprinting field.

4. The system of claim 3, wherein the portion of the imprinting field lies along an edge of the substrate.

5. The system of claim 2, wherein the first and second angles are defined by angles in degrees between the normal angle to the substrate and longitudinal axes of the imaging units.

6. The system of claim 3, wherein each imaging unit comprises an imaging system that emits a light beam in parallel alignment with the imaging unit's longitudinal axis towards its respective alignment mark.

7. The system of claim 6, wherein certain ones of the imaging units further comprise a prism to re-direct the light beam.

8. The system of claim 6, wherein certain ones of the imaging units further comprises a mirror to re-direct the light beam.

9. The system of claim 3, wherein each imaging unit comprises an imaging system that emits a light beam in non-parallel alignment with the imaging unit's longitudinal axis towards its respective alignment mark.

10. The system of claim 1, wherein $N \geq 8$ and $M \geq 6$.

11. The system as recited in claim 1, further comprising an energy source positioned to emit energy along a path, the energy capable of solidifying the material deposited between the imprint mold and the substrate, wherein the first set of imaging units and the second set of imaging units are outside of the energy path.

12. An imprint lithography system operable for imprinting a pattern into a material deposited between an imprint mold and a substrate, the system comprising:
   a first N-channel imaging system positioned at a first angle, the first N-channel imaging system including a plurality of imaging sets, the imaging sets having a first imaging unit and a second imaging unit positioned at an acute angle to each other;
   a second N-channel imaging system positioned at an angle to the first N-channel imaging system, the second N-channel imaging system including a plurality of imaging sets; and,
   a beam splitter operable for directing imaging light beams from the first N-channel imaging system and the second N-channel imaging system towards the substrate.

13. The system of claim 12, wherein the second N-channel imaging system includes at least two imaging units positioned at an acute angle relative to each other.

14. The system of claim 12, further comprising an energy source positioned to emit energy along a path, the energy capable of solidifying the material deposited between the imprint mold and the substrate, wherein the imaging units are outside of the energy path.

15. The system of claim 12, wherein the beam splitter directs imaging light beams toward at least a first alignment mark and a second alignment mark on the substrate.

16. The system of claim 15, wherein the position of the first imaging unit corresponds to a diffracting angle of the first alignment mark on the substrate and the position of the second imaging unit corresponds to the diffracting angle of the second alignment mark on the substrate.

17. An imprint lithography system comprising:
   an energy source positioned to emit energy along a path, the energy capable of solidifying material deposited between an imprint mold and a substrate;
   a first set of imaging units positioned at a first inclined angle relative to normal of the substrate; and
   a second set of imaging units positioned at a second inclined angle relative to normal of the substrate, wherein the first and second angles are not equal to each other
   wherein the first and second sets of imaging units each comprise at least four imaging units and the first set of imaging units and the second set of imaging units comprise a N-channel imaging system, further comprising:
   a M-channel imaging system having first and second N-channel imaging systems positioned at an angle to each other; and
   a beam splitter operable for directing imaging light beams from both N-channel imaging systems towards alignment marks on the substrate.

18. The system of claim 17, wherein the imaging units are operable to view alignment marks on the substrate and further comprise an imaging system that emits a light beam in parallel alignment with the imaging unit's longitudinal axis towards its respective alignment mark.

19. The system of claim 17, further comprising x-y actuators for re-aligning certain ones of the imaging units in order to align the system for imprinting of a portion of the imprinting field.

* * * * *